United States Patent
Iwano et al.

(10) Patent No.: US 12,014,930 B2
(45) Date of Patent: Jun. 18, 2024

(54) ETCHING METHOD AND PLASMA PROCESSING APPARATUS

(71) Applicant: Tokyo Electron Limited, Tokyo (JP)

(72) Inventors: Mitsuhiro Iwano, Miyagi (JP); Masanori Hosoya, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 575 days.

(21) Appl. No.: 16/979,257

(22) PCT Filed: Aug. 7, 2019

(86) PCT No.: PCT/JP2019/031227
§ 371 (c)(1),
(2) Date: Sep. 9, 2020

(87) PCT Pub. No.: WO2020/039943
PCT Pub. Date: Feb. 27, 2020

(65) Prior Publication Data
US 2021/0366718 A1    Nov. 25, 2021

(30) Foreign Application Priority Data
Aug. 21, 2018   (JP) ................. 2018-154914

(51) Int. Cl.
*H01L 21/3065*   (2006.01)
*H01J 37/32*     (2006.01)
(Continued)

(52) U.S. Cl.
CPC .... *H01L 21/3065* (2013.01); *H01J 37/32449* (2013.01); *H01J 37/3266* (2013.01);
(Continued)

(58) Field of Classification Search
CPC .......... H01L 21/3065; H01L 21/02126; H01L 21/02164; H01J 37/3266
See application file for complete search history.

(56) References Cited

U.S. PATENT DOCUMENTS

2014/0206199 A1*  7/2014  Himori ............. H01J 37/32669
                                                    438/717
2015/0017810 A1   1/2015  Guha
(Continued)

FOREIGN PATENT DOCUMENTS

CN    104867827 A    8/2015
JP    H05-051772 A   3/1993
(Continued)

OTHER PUBLICATIONS

International Search Report for PCT/JP2019/031227 dated Nov. 5, 2019.

*Primary Examiner* — Binh X Tran
(74) *Attorney, Agent, or Firm* — Pearne & Gordon LLP

(57) ABSTRACT

In an etching method, plasma from a processing gas containing a fluorocarbon gas is formed within a chamber of a plasma processing apparatus, and a deposit containing fluorocarbon is formed on a substrate. The substrate includes a first region formed of a silicon containing material and a second region formed of a metal containing material. Subsequently, plasma from a rare gas is formed within the chamber, and rare gas ions are supplied to the substrate. As a result, the first region is etched by the fluorocarbon contained in the deposit. When the plasma from the rare gas is formed, a magnetic field distribution in which a horizontal component on an edge side of the substrate is higher than a horizontal component on a center of the substrate is formed by an electromagnet.

5 Claims, 5 Drawing Sheets

(51) Int. Cl.
*H01L 21/02* (2006.01)
*H01L 21/311* (2006.01)
*H01L 21/67* (2006.01)

(52) U.S. Cl.
CPC .. *H01L 21/02126* (2013.01); *H01L 21/02164* (2013.01); *H01L 21/31116* (2013.01); *H01L 21/67069* (2013.01)

(56) References Cited

U.S. PATENT DOCUMENTS

| | | | |
|---|---|---|---|
| 2015/0243522 | A1 | 8/2015 | Kitagaito et al. |
| 2016/0379834 | A1* | 12/2016 | Katsunuma ....... H01J 37/32642 438/720 |

FOREIGN PATENT DOCUMENTS

| | | |
|---|---|---|
| JP | H05-267237 A | 10/1993 |
| JP | 2000-082695 A | 3/2000 |
| JP | 2004-303939 A | 10/2004 |
| JP | 2014-192219 A | 10/2014 |
| JP | 2015-201552 A | 11/2015 |
| JP | 2016-136606 A | 7/2016 |
| JP | 2017-011127 A | 1/2017 |
| JP | 2019-061848 A | 4/2019 |
| JP | 2019-061849 A | 4/2019 |
| TW | 201519311 A | 5/2015 |

* cited by examiner

ETCHING METHOD AND PLASMA PROCESSING APPARATUS

CROSS-REFERENCE TO RELATED APPLICATION

This Application is a U.S. national phase application under 35 U.S.C. § 371 of PCT Application No. PCT/JP2019/031227 filed on Aug. 7, 2019, which claims the benefit of Japanese Patent Application No. 2018-154914 filed on Aug. 21, 2018, the entire disclosures of which are incorporated herein by reference.

TECHNICAL FIELD

The various aspects and embodiments described herein pertain generally to an etching method and a plasma processing apparatus.

BACKGROUND

In the manufacturing of electronic devices, plasma etching is performed using a plasma processing apparatus. In the plasma etching, a first region of a substrate is selectively etched with respect to a second region of the substrate. The second region is formed of a material different from that of the first region. Patent Document 1 discloses a method for selectively etching a first region of silicon oxide with respect to a second region of silicon nitride.

According to the method disclosed in Patent Document 1, a deposit containing fluorocarbon is formed on a substrate. To form the deposit, plasma from a fluorocarbon gas is formed in a chamber of a plasma processing apparatus. Then, ions of a rare gas are supplied onto the substrate. To generate the ions of the rare gas, plasma of the rare gas is formed in the chamber. When the ions of the rare gas are supplied onto the substrate, fluorocarbon contained in the deposit reacts with silicon oxide in the first region. As a result, the first region is etched. Meanwhile, the second region is protected by the deposit.

PRIOR ART DOCUMENT

Patent Document 1: Japanese Patent Laid-open Publication No. 2016-136606

SUMMARY

In one exemplary embodiment, an etching method performed in a plasma processing apparatus is provided. The etching method is performed in a state where a substrate is placed in a chamber of the plasma processing apparatus. The etching method includes forming plasma from a processing gas containing a fluorocarbon gas within the chamber to form a deposit containing fluorocarbon on the substrate. The substrate has a first region formed of a silicon containing material and a second region formed of a metal containing material. Further, the etching method further includes forming plasma from a rare gas within the chamber to etch the first region by supplying rare gas ions to the substrate to react the fluorocarbon contained in the deposit on the substrate with the silicon containing material of the first region. In the forming of the plasma from the rare gas, a magnetic field distribution in which a horizontal component on an edge side of the substrate is higher than a horizontal component on a center of the substrate is formed by an electromagnet.

DETAILED DESCRIPTION

Figure 1:
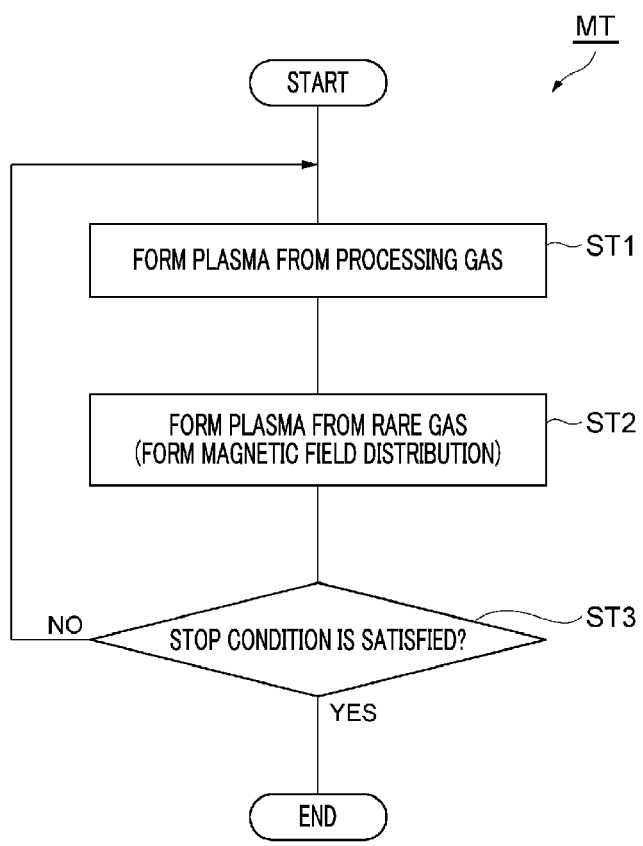
FIG. 1 is a flowchart showing an etching method according to an exemplary embodiment.

Hereinafter, various exemplary embodiments will be described.

In one exemplary embodiment, an etching method performed in a plasma processing apparatus is provided. The etching method is performed in a state where a substrate is placed in a chamber of the plasma processing apparatus. The etching method includes forming plasma from a processing gas containing a fluorocarbon gas within the chamber to form a deposit containing fluorocarbon on the substrate. The substrate has a first region formed of a silicon containing material and a second region formed of a metal containing material. Further, the etching method further includes forming plasma from a rare gas within the chamber to etch the first region by supplying rare gas ions to the substrate to react the fluorocarbon contained in the deposit on the substrate with the silicon containing material of the first region. In the forming of the plasma from the rare gas, a magnetic field distribution in which a horizontal component on an edge side of the substrate is higher than a horizontal component on a center of the substrate is formed by an electromagnet.

Generally, in the plasma processing apparatus, the density of plasma increases on the center of the substrate and decreases on the edge side of the substrate. In the above-described exemplary embodiment, the magnetic field distribution in which the horizontal component on the edge side of the substrate is higher than the horizontal component on the center of the substrate is formed while the rare gas ions are generated. Therefore, the density of plasma on the edge side of the substrate increases. As a result, the plasma has the uniform density distribution in the diametric direction. Since the rare gas ions from the plasma having the above-described uniform density distribution are incident to the substrate, the reaction between the fluorocarbon contained in the deposit and the silicon containing material of the first region is promoted. The second region is protected by the deposit. Therefore, the in-plane uniformity in the processing of selectively etching the first region of the substrate with respect to the second region of the substrate can be improved.

The silicon containing material may be $SiO_2$, SiOC or SiOCH.

The metal containing material may be any one of metal materials of titanium, tungsten, zirconium, aluminum, tantalum, cobalt or ruthenium, or an oxide, a nitride or a carbide of the corresponding metal material.

The fluorocarbon gas may contain a $C_4F_8$ gas and/or a $C_4F_6$ gas.

The forming of the plasma from the processing gas and the forming of the plasma from the rare gas may be alternately repeated.

In another exemplary embodiment, a plasma processing apparatus is provided. The plasma processing apparatus includes a chamber; a substrate supporting table; a gas supply; a high frequency power supply; an electromagnet; a drive power supply and a controller. The substrate supporting table has a lower electrode and is provided within the chamber. The gas supply is configured to supply a processing gas containing a fluorocarbon gas and a rare gas into the chamber. The high frequency power supply I configured to generate a high frequency power to excite a gas within the chamber. The electromagnet is configured to form a magnetic field within an interior space of the chamber. The drive power supply is configured to supply a current to the electromagnet. The controller is configured to control the gas supply, the high frequency power supply and the drive power supply. The controller performs a first control and a second control. In the first control, the controller controls the gas supply to supply the processing gas into the chamber and controlling the high frequency power supply to supply the high frequency power to form a deposit containing fluorocarbon from plasma formed from the processing gas on a substrate placed on the substrate supporting. In the second control, the controller controls the gas supply to supply the rare gas into the chamber and controls the high frequency power supply to supply the high frequency power to supply rare gas ions to the substrate on which the deposit is formed. The controller controls the drive power supply to form a magnetic field distribution in which a horizontal component on an edge side of the substrate is higher than a horizontal component on a center of the substrate by the electromagnet.

The fluorocarbon gas may contain a $C_4F_8$ gas and/or a $C_4F_6$ gas.

The controller may be configured to alternately repeat the first control and the second control.

Hereinafter, various exemplary embodiments of the present disclosure will be explained with reference to the accompanying drawings. Further, in the drawings, similar symbols typically identify similar components unless context dictates otherwise.

FIG. 1 is a flowchart showing an etching method according to an exemplary embodiment. The etching method (hereinafter, referred to as "method MT") according to the exemplary embodiment is performed to selectively etch a first region of a substrate with respect to a second region thereof.

Figure 2:
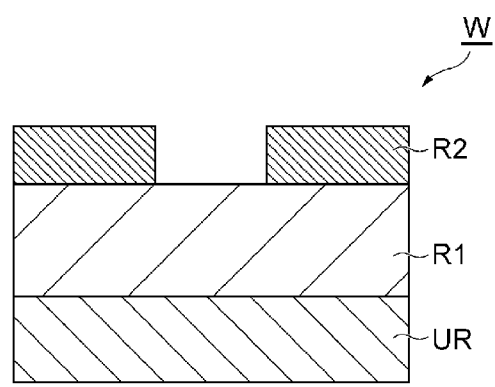
FIG. 2 is a partial cross-sectional view of an example of a substrate.

FIG. 2 is a partial cross-sectional view of an example of a substrate. An example of a substrate W illustrated in FIG. 2 can be processed by the method MT. The substrate W may have a disc shape like a wafer. The substrate W has a first region R1 and a second region R2. The substrate W may further have an underlying region UR. The first region R1 and the second region R2 are provided on the underlying region UR. In the exemplary embodiment, the first region R1 is provided on the underlying region UR and the second region R2 is provided on the first region R1. The second region R2 is patterned like a mask. That is, the second region R2 provides an opening. In another exemplary embodiment, the first region R1 may be formed to fill a recess provided by the second region R2.

The first region R1 is a region to be selectively etched. The first region R1 is formed of a silicon containing material. The silicon containing material of the first region R1 is, for example, $SiO_2$. The silicon containing material of the first region R1 may be a low dielectric constant material. The low dielectric constant material is, for example, SiOC or SiOCH.

The second region R2 is formed of a metal containing material. The metal containing material is any one of metal materials, for example, titanium, tungsten, zirconium, aluminum, tantalum, cobalt or ruthenium, or an oxide, a nitride or a carbide of the metal material.

Figure 3:
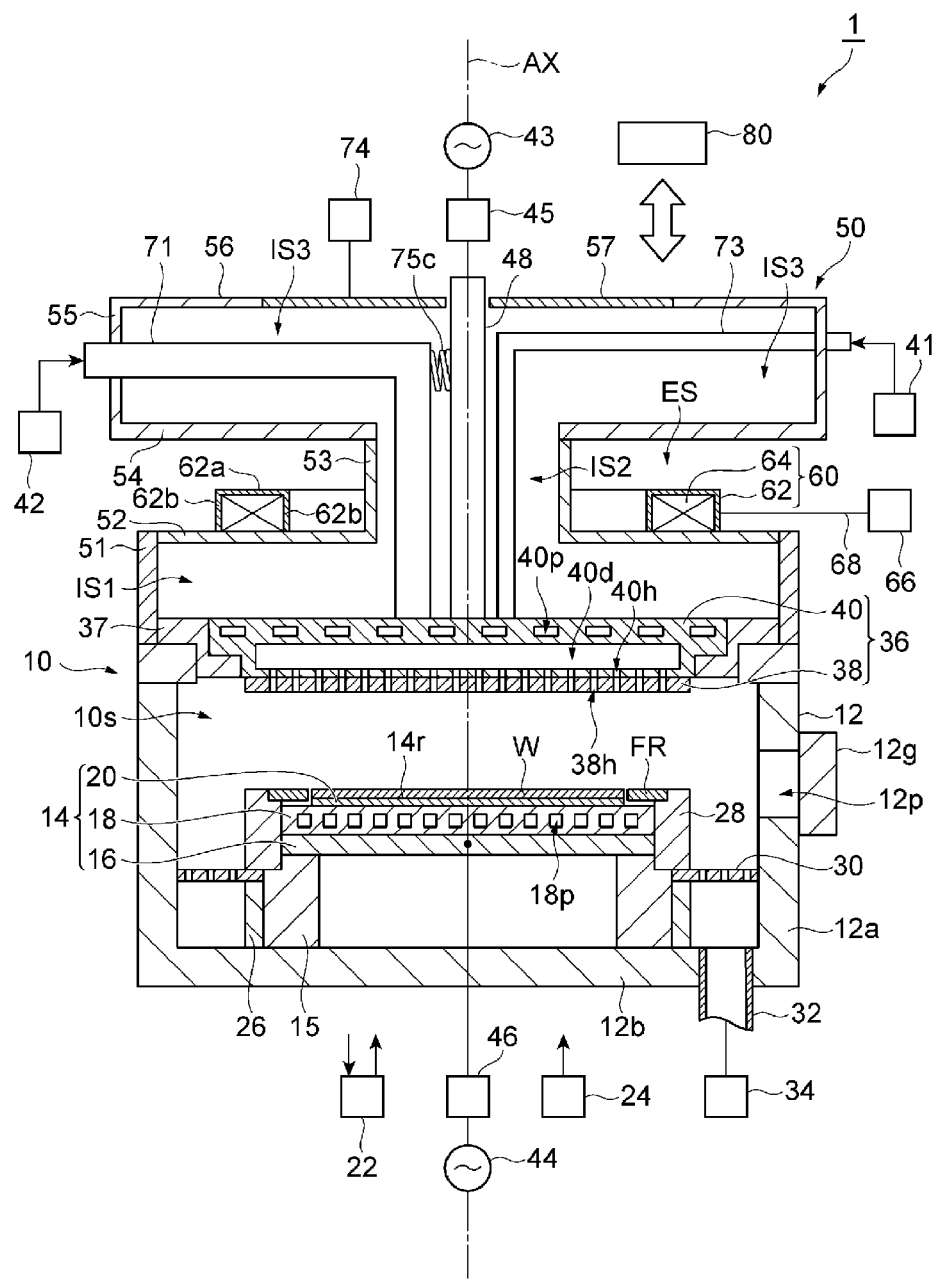
FIG. 3 is a diagram schematically illustrating a plasma processing apparatus according to the exemplary embodiment.

The method MT is performed in a state where the substrate is placed within a chamber of a plasma processing apparatus. FIG. 3 is a diagram schematically illustrating a plasma processing apparatus according to the exemplary embodiment. A plasma processing apparatus 1 illustrated in FIG. 3 includes a chamber 10. The chamber 10 is a container in which an interior space 10s is provided. The chamber 10 has an approximately cylindrical shape. A central axis AX illustrated in FIG. 3 is the central axis of the chamber 10 and the interior space 10s.

The chamber 10 includes a chamber main body 12. The chamber main body 12 has an approximately cylindrical shape. The interior space 10s of the chamber 10 is provided within the chamber main body 12. The chamber main body 12 includes a side wall 12a and a bottom portion 12b. The side wall 12a constitutes a side wall of the chamber 10. The bottom portion 12b constitutes a bottom portion of the chamber 10. The chamber main body 12 is formed of a metal such as aluminum. A film having plasma resistance is formed on an inner wall surface of the chamber main body 12. This film may be a ceramic film such as an alumite film or an yttrium oxide film. The chamber main body 12 is grounded.

A passage 12p is formed at the side wall 12a. The substrate W is transferred between the interior space 10s and the outside of the chamber 10 through the passage 12p. The passage 12p can be opened or closed by a gate valve 12g. The gate valve 12g is provided along the side wall 12a.

A substrate supporting table, i.e., a supporting table 14, is provided within the interior space 10s. The supporting table 14 is supported by a supporting body 15. The supporting body 15 has a cylindrical shape. The supporting body 15 is extended upwards from the bottom portion 12b of the chamber main body 12. The supporting body 15 has the insulating property. The supporting body 15 is formed of, for example, ceramic.

The supporting table 14 is configured to support the substrate W. The supporting table 14 commonly shares the central axis AX with the chamber 10. A placing region 14r is provided on the supporting table 14. The center of the placing region 14r is located on the central axis AX. The substrate W is placed on the placing region 14r such that the center of the substrate W is located on the central axis AX.

The supporting table 14 includes an electrode plate 16, a lower electrode 18 and an electrostatic chuck 20. The electrode plate 16 has an approximately disc shape. The electrode plate 16 has conductivity. The electrode plate 16 is formed of a metal such as aluminum. The lower electrode 18 has a disc shape. The lower electrode 18 has conductivity. The lower electrode 18 is formed of a metal such as aluminum. The lower electrode 18 is provided on the electrode plate 16. The lower electrode 18 is electrically connected to the electrode plate 16.

A flow path 18p is formed within the lower electrode 18. The flow path 18p is extended in, for example, a spiral shape within the lower electrode 18. A heat exchange medium (e.g., coolant) is supplied into the flow path 18p from a circulation unit 22 (e.g., chiller unit) for circulating the heat exchange medium. The circulation unit 22 is provided outside the chamber 10. The heat exchange medium supplied into the flow path 18p is returned back to the circulation unit 22. A temperature of the substrate W placed on the supporting table 14 is adjusted by heat exchange between the heat exchange medium and the lower electrode 18.

The electrostatic chuck 20 is provided on the lower electrode 18. The electrostatic chuck 20 has an approximately disc shape. The electrostatic chuck 20 has a main body and an electrode. The main body of the electrostatic chuck 20 is formed of a dielectric material (for example, ceramic). The electrode of the electrostatic chuck 20 is a conductive film and provided within the main body of the electrostatic chuck 20. The electrode of the electrostatic chuck 20 is connected to a DC power supply 24 via a switch. The electrostatic chuck 20 provides the above-described placing region 14r. When a DC voltage is applied to the electrode of the electrostatic chuck 20 from the DC power supply 24 in a state where the substrate W is placed on the electrostatic chuck 20 (on the placing region 14r), electrostatic attraction force is generated between the substrate W and the electrostatic chuck 20. The substrate W is attracted to the electrostatic chuck 20 by the generated electrostatic attraction force and held on the electrostatic chuck 20. The plasma processing apparatus 1 may be equipped with a heat transfer gas supply line through which a heat transfer gas (for example, He gas) is supplied between the electrostatic chuck 20 and a rear surface of the substrate W.

One or more heaters (for example, one or more resistance heating devices) may be provided within the electrostatic chuck 20. When a power is supplied to one or more heaters from a heater controller, the one or more heaters generate heat, and, thus, the temperature of the electrostatic chuck 20 and the temperature of the substrate W can be controlled.

A focus ring FR is provided on the supporting table 14. The focus ring FR is placed to surround the edges of the electrostatic chuck 20 and the substrate W. The focus ring FR is an annular plate and formed of a silicon containing material such as silicon, quartz or the like. The focus ring FR is provided to improve the uniformity in a plasma processing.

A cylindrical conductor 26 is provided around the supporting body 15. The conductor 26 is grounded. A cylindrical insulator 28 is provided above the conductor 26 to surround the supporting table 14. The insulator 28 is formed of ceramic such as quartz. An exhaust path is formed between the supporting table 14 and the side wall 12a of the chamber main body 12. A baffle plate 30 is provided in the exhaust path. The baffle plate 30 is an annular plate. A plurality of holes is formed in the baffle plate 30 to penetrate the baffle plate 30 in a thickness direction thereof. The baffle plate 30 is formed of a metal member, such as aluminum, coated with a film, such as yttrium oxide, having plasma resistance.

Under the baffle plate 30, an exhaust line 32 is connected to the bottom portion 12b of the chamber main body 12. The exhaust line 32 can communicate with the exhaust path. The exhaust line 32 is connected to an exhaust device 34. The exhaust device 34 includes an automatic pressure control valve and a vacuum pump such as a turbo molecular pump. When the exhaust device 34 is operated, the pressure within the interior space 10s is set to a predetermined level.

An upper electrode 36 is provided above the supporting table 14. A part of the interior space 10s is interposed between the upper electrode 36 and the supporting table 14. The upper electrode 36 is provided to close an upper opening of the chamber main body 12. A member 37 is interposed between the upper electrode 36 and an upper end portion of the chamber main body 12. The member 37 is formed of an insulating material. The member 37 may be formed of ceramic, for example, quartz. In the exemplary embodiment, the member 37 and a part of a ground conductor to be described later may be interposed between the upper electrode 36 and the upper end portion of the chamber main body 12.

In the exemplary embodiment, the upper electrode 36 constitutes a shower head. In the exemplary embodiment, the upper electrode 36 includes a ceiling plate 38 and a supporting body 40. The ceiling plate 38 is formed of, for example, silicon. Otherwise, the ceiling plate 38 is formed of an aluminum member coated with a ceramic film, such as yttrium oxide. A plurality of gas discharge holes 38h is formed in the ceiling plate 38 to penetrate the ceiling plate 38 in a thickness direction thereof.

The supporting body 40 is provided on the ceiling plate 38. The supporting body 40 is configured to detachably support the ceiling plate 38. The supporting body 40 is formed of a conductive material such as aluminum. A gas diffusion space 40d is formed within the supporting body 40. A plurality of holes 40h is formed in the supporting body 40. The plurality of holes 40h is extended downwards from the gas diffusion space 40d. The holes 40h communicate with the gas discharge holes 38h, respectively.

The gas diffusion space 40d is connected to a gas supply 41. The gas supply 41 is configured to supply a gas into the chamber 10, i.e., into the interior space 10s. The gas supply 41 is configured to supply a plurality of gases used in the method MT. The plurality of gases used in the method MT includes a fluorocarbon gas and a rare gas. The fluorocarbon gas includes one or more of, for example, $C_4F_6$ gas, $C_4F_8$ gas and $C_6F_8$ gas, but may be another fluorocarbon gas. The rare gas is, for example, Ar gas, but may be another rare gas. The plurality of gases used in the method MT may further include other gases. The plurality of gases used in the method MT may further include one or more of a nitrogen gas ($N_2$ gas) and an oxygen containing gas (for example, $O_2$ gas or CO gas). The gas supply 41 is equipped with a plurality of flow rate controllers and a plurality of valves. The gas supply 41 is configured to individually adjust the flow rates of one or more gases to be supplied. The gas supplied from the gas supply 41 is discharged into the interior space 10s from the plurality of gas discharge holes 38h through the gas diffusion space 40d and the plurality of holes 40h.

A flow path 40p is formed in the supporting body 40. A chiller unit 42 is connected to the flow path 40p. A coolant such as cooling water is circulated between the flow path 40p and the chiller unit 42. A temperature of the upper electrode 36 is adjusted by heat exchange between the upper electrode 36 and the coolant supplied from the chiller unit 42 to the flow path 40p.

The plasma processing apparatus 1 further includes a first high frequency power supply 43 and a second high frequency power supply 44. The first high frequency power supply 43 and the second high frequency power supply 44 are provided outside the chamber 10. The first high frequency power supply 43 is configured to mainly generate a first high frequency power for plasma formation. The first high frequency power may have a frequency of, for example, 100 MHz, but is not limited thereto. The first high frequency power supply 43 is electrically connected to the upper electrode 36 via a matching device 45 and a power feed conductor 48. The matching device 45 includes a matching circuit configured to match an output impedance of the first high frequency power supply 43 with an impedance of a load side (the upper electrode 36 side). A lower end of the power feed conductor 48 is connected to the upper electrode 36. The power feed conductor 48 is extended upwards from the upper electrode 36. The power feed conductor 48 is a cylindrical or rod-shaped conductor, and a central axis of the power feed conductor 48 substantially coincides with the central axis AX. Further, the first high frequency power supply 43 may be electrically connected to the lower electrode 18, instead of the upper electrode 36, via the matching device 45.

The second high frequency power supply 44 is configured to mainly generate a second high frequency power, i.e., high frequency bias power, for ion attraction to the substrate W. A frequency of the second high frequency power is lower than the frequency of the first high frequency power. In the exemplary embodiment, the frequency of the second high frequency power may be greater than 13.56 MHz. In the exemplary embodiment, the frequency of the second high frequency power may be equal to or greater than 40 MHz. In the exemplary embodiment, the frequency of the second high frequency power may be equal to or greater than 60 MHz. The second high frequency power supply 44 is electrically connected to the lower electrode 18 via a matching device 46. The matching device 46 includes a matching circuit configured to match an output impedance of the second high frequency power supply 44 with an impedance of a load side (the lower electrode 18 side).

The plasma processing apparatus 1 further includes a ground conductor 50. The ground conductor 50 has conductivity. The ground conductor 50 is formed of a metal such as aluminum. The ground conductor 50 is grounded. The ground conductor 50 is extended to cover the upper electrode 36 above the chamber main body 12. The power feed conductor 48 is extended upwards through a space surrounded by the ground conductor 50 and is connected to the first high frequency power supply 43 via the matching device 45 outside the ground conductor 50.

In the interior space 10s of the plasma processing apparatus 1, an electric field intensity distribution having a high electric field intensity on the center of the substrate W and a low electric field intensity on the edge side of the substrate W may be formed. That is, a non-uniform electric field intensity distribution in which the electric field intensity decreases as the distance from the central axis AX increases in a radial direction (i.e., a diametric direction) may be formed within the interior space 10s. Under the non-uniform electric field intensity distribution, the density of plasma is high near the central axis AX and low in a portion distant from the central axis AX. That is, a non-uniform plasma density distribution is formed in the radial direction with respect to the central axis AX. The plasma processing apparatus 1 further includes an electromagnet 60 in order to obtain a uniform plasma density distribution.

As illustrated in FIG. 3, the electromagnet 60 is placed above the upper electrode 36. The electromagnet 60 is configured to form a magnetic field distribution, in which a horizontal component at a portion distanced from the central axis AX is higher than a horizontal component on the central axis AX, within the interior space 10s. That is, the electromagnet 60 forms a magnetic field distribution having a horizontal component, whose magnitude increases as the distance from the central axis AX increases in the radial direction, within the interior space 10s. In a portion in which a magnetic field having a high horizontal component is formed, the residence time of electrons increases. As a result, the density of plasma increases in the portion in which the magnetic field having the high horizontal component is formed. Thus, in the plasma processing apparatus 1, it is possible to obtain a uniform plasma density distribution in the radial direction with respect to the central axis AX. Therefore, in the plasma processing apparatus 1, the in-plane uniformity of the processing on the substrate W is improved.

In the exemplary embodiment, the electromagnet 60 includes a yoke 62 and a coil 64. The yoke 62 is formed of a magnetic material. The yoke 62 includes a base portion 62a and a plurality of cylindrical portions 62b. The base portion 62a has an approximately annular shape and approximately disc shape, and is extended in a direction orthogonal to the central axis AX. Each of the plurality of cylindrical portions 62b has a cylindrical shape and is extended downwards from the base portion 62a. The plurality of cylindrical portions 62b is provided coaxially with respect to the central axis AX. The coil 64 is wound around the central axis AX. The coil 64 is provided between two adjacent cylindrical portions 62b in the radial direction. In addition, the electromagnet 60 may include one or more coils 64. If the electromagnet 60 includes a plurality of coils 64, the plurality of coils 64 is provided coaxially with respect to the central axis AX.

The coil 64 of the electromagnet 60 is connected to a drive power supply 66 via a wire 68. When a current is applied from the drive power supply 66 to the coil 64, a magnetic field is formed by the electromagnet 60. In a portion in which an angle of a vector of the magnetic field formed by the electromagnet 60 is 45°, the electron confinement effect (the effect of suppressing diffusion of electrons) in the radial direction (diametric direction) and the effect of suppressing annihilation of electrons (the effect of suppressing electrons from reaching the electrode) are well compatible with each other. Therefore, the density of plasma increases in the corresponding portion. Thus, when the radius of the substrate W is, for example, 150 mm, the electromagnet 60 may be configured such that the distance between the portion in which the angle of the vector of the magnetic field is 45° and the central axis AX is 135 mm or more and 185 mm or less. Therefore, in the exemplary embodiment, the average of the inner diameter and the outer diameter of one coil 64 of the electromagnet 60 is set to be equal to or greater than the distance between the central axis AX and the edge of the substrate W. When the radius of the substrate W is 150 mm, the average of the inner diameter and the outer diameter of the coil 64 of the electromagnet 60 is set to 150 mm or more and 250 mm or less. In addition, the angle of the vector of the magnetic field is 0° when the magnetic field has only a downward component, and is 90° when the magnetic field has only a component (horizontal component) in the radial direction. Thus, when the angle of the vector of the magnetic field is 45°, the magnetic field has both a horizontal component and a vertical component.

When the electromagnet 60 is placed in the space surrounded by the ground conductor covering the upper electrode, the first high frequency power is introduced into the electromagnet 60 and/or a wire that connects the electromagnet 60 and a power supply (drive power supply). As a result, the electric field intensity within the interior space 10s varies locally. Thus, the electromagnet 60 is placed outside the ground conductor. However, when the electromagnet 60 is placed in a space above an upper end of the ground conductor, the distance in the vertical direction from the electromagnet 60 to the interior space 10s increases. Therefore, if a high current is not applied to the coil 64, a magnetic field having a sufficient magnitude cannot be efficiently formed within the interior space 10s. In addition, when the electromagnet 60 is placed on a lateral side of the ground conductor (outside the ground conductor in the radial direction from the central axis), the portion in which the magnetic field having the high horizontal component is formed or the portion in which the magnetic field, the vector of which has an angle of 45°, is provided outside the interior space 10s. In order to efficiently form a magnetic field distribution suitable for obtaining the uniform plasma density distribution within the interior space 10s, the ground conductor 50 is provided with an exterior space ES in which the electromagnet 60 is placed. The exterior space ES is located closer to the interior space 10s than the upper end of the ground conductor 50. Further, the exterior space ES is separated upwards from the upper electrode 36, and is shielded from the upper electrode 36 by the ground conductor 50.

The ground conductor 50 includes a first portion 51, a second portion 52 and a third portion 53. The first portion 51 has a cylindrical shape. A central axis of the first portion 51 approximately coincides with the central axis AX. The first portion 51 is extended upwards from the chamber main body 12. In the example illustrated in FIG. 3, the first portion 51 is extended upwards from an upper end of the side wall 12a of the chamber main body 12. A lower end portion of the first portion 51 is interposed between the member 37 and the upper end of the side wall 12a.

The second portion 52 is spaced apart upwards from the upper electrode 36 and extended from the first portion 51 toward the central axis AX. The second portion 52 has a plate shape that is extended in a direction intersecting or orthogonal to the central axis AX. The first portion 51 and the second portion 52 provide a first space IS1 above the upper electrode 36. The first space IS1 is a part of a space within the ground conductor 50 (i.e., at the upper electrode 36 side). The first space IS1 provides a distance in the vertical direction between the upper electrode 36 and the ground conductor 50. Thus, capacitive coupling between the ground conductor 50 and the upper electrode 36 is suppressed. The distance in the vertical direction between an upper surface of the upper electrode 36 and a lower surface of the second portion 52 of the ground conductor 50 is set to, for example, 60 mm or more.

The third portion 53 has a cylindrical shape. A central axis of the third portion 53 approximately coincides with the central axis AX. The third portion 53 is extended closer to the central axis than the first portion 51. The third portion 53 is extended upwards from the second portion 52. The third portion 53 provides a second space IS2. The second space IS2 is a space within the second portion 52 and is a part of the space within the ground conductor 50 (i.e., at the upper electrode 36 side). The second space IS2 is continuous with the first space IS1. In addition, the power feed conductor 48 is extended upwards through the first space IS1 and the second space IS2.

The exterior space ES is provided by the ground conductor 50 at the outside of the third portion 53, on the second portion 52 and above the interior space 10s. The exterior space ES is extended in a circumferential direction around the central axis AX at the outside of the third portion 53 and on the second portion 52. The electromagnet 60 is placed in the exterior space ES. Further, the distance in the vertical direction between a lower end of the electromagnet 60 placed in the exterior space ES and the upper surface of the upper electrode 36 is greater than 60 mm. Also, the distance in the vertical direction between the lower end of the electromagnet 60 and the substrate W placed on the supporting table 14 may be equal to or less than 230 mm.

The distance between the electromagnet 60 placed in the exterior space ES and the interior space 10s is relatively short. Further, as described above, the electromagnet 60 forms, within the interior space 10s, the magnetic field distribution having the low horizontal component near the central axis AX and the high horizontal component at the portion distanced from the central axis. Thus, by the electromagnet 60 placed outside the ground conductor 50, the magnetic field distribution suitable for obtaining the uniform plasma density distribution may be efficiently formed within the interior space 10s.

The drive power supply 66 is connected to the coil 64 of the electromagnet 60 as described above. The electromagnet 60 and the drive power supply 66 are placed outside the ground conductor 50. Thus, a filter configured to suppress the high frequency power from being introduced into the drive power supply 66 may not be provided between the coil 64 and the drive power supply 66.

In the exemplary embodiment, the ground conductor 50 further includes a fourth portion 54, a fifth portion 55 and a sixth portion 56. The fourth portion 54 is extended above the second portion 52 from the third portion 53 in the radial direction with respect to the central axis AX. The fourth portion 54 has a plate shape that is extended in the direction intersecting or orthogonal to the central axis AX. The fifth portion 55 has a cylindrical shape. A central axis of the fifth portion 55 approximately coincides with the central axis AX. The fifth portion 55 is farther away from the central axis than the third portion 53 and extended upwards from the fourth portion 54. The sixth portion 56 is extended above the fourth portion 54 from the fifth portion 55 toward the central axis AX. The sixth portion 56 has a plate shape that is extended in the direction intersecting or orthogonal to the central axis AX. In the exemplary embodiment, the ground conductor 50 further includes a lid 57 that is extended from the sixth portion to near the power feed conductor 48.

The fourth portion 54, the fifth portion 55 and the sixth portion 56 provide a third space IS3. The third space IS 3 is a space surrounded by the fourth portion 54, the fifth portion 55 and the sixth portion 56 and is a part of the space within the ground conductor 50. The third space IS3 is continuous with the second space IS2. The power feed conductor 48 is further extended upwards through the third space IS3. Further, in the example illustrated in FIG. 3, the first portion to the sixth portion are constituted by three members, but the number of members constituting the ground conductor 50 may be any arbitrary number.

Figure 4:
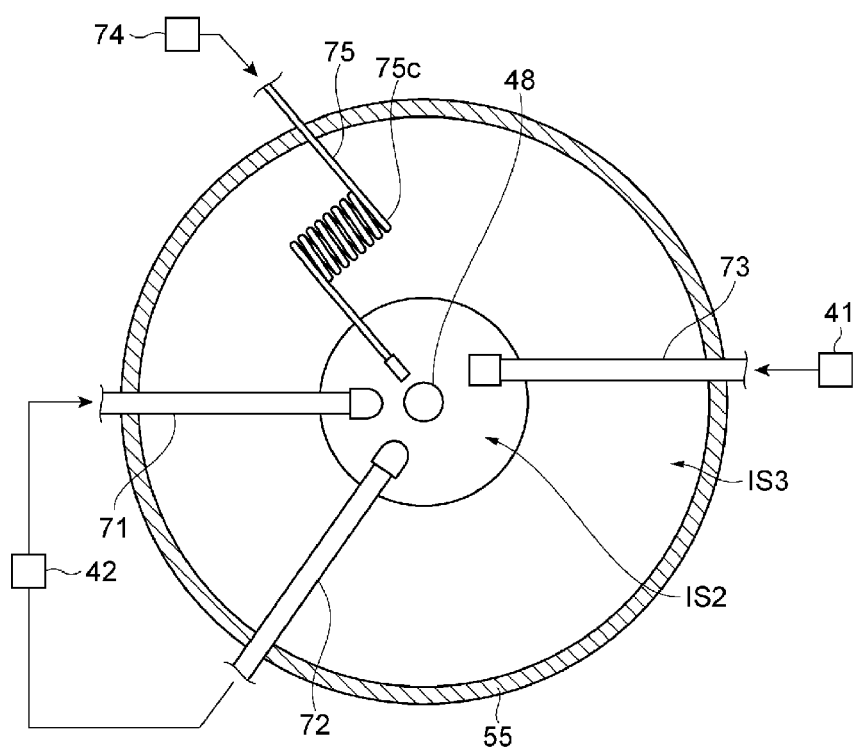
FIG. 4 is a plan view illustrating an example of a configuration within a ground conductor of the plasma processing apparatus illustrated in FIG. 3.

Hereinafter, reference will be made on FIG. 4 together with FIG. 3. FIG. 4 is a plan view illustrating an example of a configuration within the ground conductor of the plasma processing apparatus illustrated in FIG. 3. FIG. 4 illustrates a state where the fifth portion 55 of the ground conductor 50 is cut in a horizontal plane. In the exemplary embodiment, the plasma processing apparatus 1 further includes a pipe 71 as illustrated in FIG. 3 and FIG. 4. The pipe 71 is extended upwards from the upper electrode 36 through the first space IS1 and the second space IS2, and passes through the third space IS3 to be extended to the lateral side and the outside of the ground conductor 50. The pipe 71 is connected to the chiller unit 42 outside the ground conductor 50. A coolant from the chiller unit 42 is supplied into the flow path 40p via the pipe 71. In the third space IS3, the pipe 71 is substantially shielded from the upper electrode 36 by the fourth portion 54 of the ground conductor 50.

The plasma processing apparatus 1 further includes a pipe 72. The pipe 72 is extended upwards through the first space IS1 and the second space IS2, and passes through the third space IS3 to be extended to the lateral side and the outside of the ground conductor 50. The pipe 72 is connected to the chiller unit 42 outside the ground conductor 50. The coolant returns from the flow path 40$p$ to the chiller unit 42 via the pipe 72. In the third space IS3, the pipe 72 is substantially shielded from the upper electrode 36 by the fourth portion 54 of the ground conductor 50.

In the exemplary embodiment, the plasma processing apparatus 1 further includes a pipe 73. The pipe 73 is extended upwards from the upper electrode 36 through the first space IS1 and the second space IS2, and passes through the third space IS3 to be extended to the lateral side and the outside of the ground conductor 50. The pipe 73 is connected to the gas supply 41 outside the ground conductor 50. A gas output from the gas supply 41 is supplied to the upper electrode 36, i.e., the shower head via the pipe 73. In the third space IS3, the pipe 73 is substantially shielded from the upper electrode 36 by the fourth portion 54 of the ground conductor 50. Further, the gas supply 41 and the upper electrode 36 (i.e., the shower head) may be connected to each other via a plurality of pipes.

In the exemplary embodiment, the plasma processing apparatus 1 further includes a DC power supply 74 and a wire 75. The DC power supply 74 is configured to generate a negative DC voltage to be applied to the upper electrode 36. The wire 75 connects the DC power supply 74 and the upper electrode 36 to each other. The wire 75 may include a coil 75$c$. The coil 75$c$ is provided within the third space IS3. The wire 75 is extended upwards from the upper electrode 36 through the first space IS1 and the second space IS, and passes through the third space IS3 to be extended to the lateral side and the outside of the ground conductor 50. The wire 75 is electrically insulated from the fifth portion 55 and the ground conductor 50. The wire 75 is connected to the DC power supply 74 outside the ground conductor 50. In the third space IS3, the wire 75 is substantially shielded from the upper electrode 36 by the fourth portion 54 of the ground conductor 50.

In the exemplary embodiment, the plasma processing apparatus 1 further includes a controller 80. The controller 80 is configured to control components of the plasma processing apparatus 1. The controller 80 may be a computer device. The controller 80 may include a processor, a storage such as a memory, an input device such as a keyboard, a mouse or a touch panel, a display device, an input/output interface of a control signal, and the like. The storage is configured to store control programs and recipe data. The processor of the controller 80 executes the control programs and sends a control signal for controlling each component of the plasma processing apparatus 1 according to the recipe data. The controller 80 can control each component of the plasma processing apparatus 1 in order to perform the method MT.

Figure 5A:
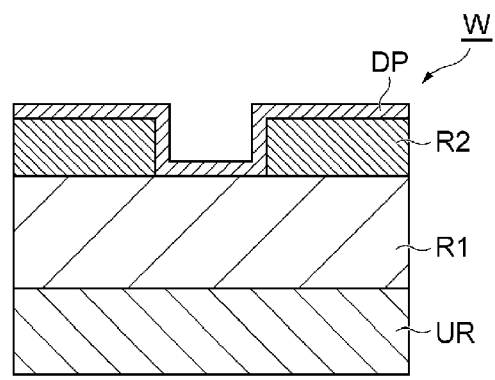
FIG. 5A is a partial cross-sectional view of an example of a substrate to which a process ST1 of a method MT illustrated in FIG. 1 is applied.
Figure 5B:
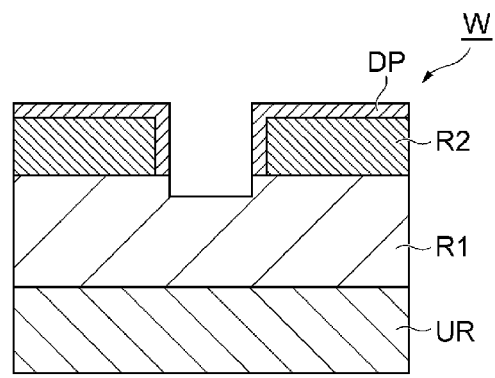
FIG. 5B is a partial cross-sectional view of an example of the substrate to which a process ST2 of the method MT is applied.
Figure 5C:
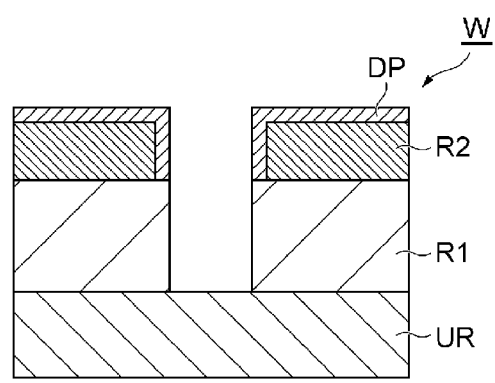
FIG. 5C is a partial cross-sectional view of an example of the substrate after the method MT is ended.

Reference will be made on FIG. 1 again. Further, reference will be made on FIG. 5A, FIG. 5B and FIG. 5C in addition to FIG. 1. FIG. 5A is a partial cross-sectional view of an example of a substrate to which a process ST1 of a method MT illustrated in FIG. 1 is applied. FIG. 5B is a partial cross-sectional view of an example of the substrate to which a process ST2 of the method MT is applied. FIG. 5C is a partial cross-sectional view of an example of the substrate after the method MT is ended. Hereinafter, the method MT will be explained with reference to a case where the method MT is applied to the substrate W illustrated in FIG. 2 by using the plasma processing apparatus 1. Also, hereinafter, control of each component of the plasma processing apparatus 1 by the controller 80 will be described.

In the method MT, the substrate W is placed on the supporting table 14 (on the electrostatic chuck 20) and held on the electrostatic chuck 20. Further, in the method MT, a process ST1 is performed. In the process ST1, plasma from a processing gas is formed within the chamber 10 to form a deposit DP on the substrate W as illustrated in FIG. 5A. The processing gas used in the process ST1 contains a fluorocarbon gas. The deposit DP contains fluorocarbon. The fluorocarbon contained in the deposit DP is supplied from the plasma formed from the processing gas.

The fluorocarbon gas used in the process ST1 may include any one of $C_4F_6$ gas, $C_4F_8$ gas and $C_6F_8$ gas. The processing gas used in the process ST1 may further contain one or more other gases in addition to the fluorocarbon gas. If the first region R1 of the substrate W is formed of the low dielectric constant material (for example, SiOC or SiOCH), the processing gas used in the process ST1 may further contain a rare gas (for example, Ar gas) in addition to the fluorocarbon gas. Otherwise, if the first region R1 of the substrate W is formed of the low dielectric constant material (for example, SiOC or SiOCH), the processing gas used in the process ST1 may further contain a rare gas (for example, Ar gas) and a nitrogen gas ($N_2$ gas) in addition to the fluorocarbon gas.

If the first region R1 of the substrate W is formed of $SiO_2$, the processing gas used in the process ST1 may further contain a rare gas (for example, Ar gas) in addition to the fluorocarbon gas. Otherwise, if the first region R1 of the substrate W is formed of $SiO_2$, the processing gas used in the process ST1 may further contain a rare gas (for example, Ar gas) and an oxygen containing gas (for example, $O_2$ gas or CO gas) in addition to the fluorocarbon gas.

The controller 80 performs a first control to perform the process ST1. In the first control, the controller 80 controls the gas supply 41 to supply the processing gas into the chamber 10 and controls the first high frequency power supply 43 to supply a first high frequency power. In the first control, the controller 80 may further control the exhaust device 34 to adjust the pressure within the chamber 10. In the first control, the controller 80 may further control the second high frequency power supply 44 to stop the supply of the second high frequency power. Otherwise, in the first control, the controller 80 may further control the second high frequency power supply 44 to supply the second high frequency power. Meanwhile, a power level of the second high frequency power in the first control is set to be lower than a power level of the second high frequency power in a second control (control of a process ST2) to be described later.

In the process ST1, the processing gas is excited within the chamber 10 and the plasma is formed from the processing gas. The fluorocarbon contained in the plasma is deposited on the substrate W to form the deposit DP on the substrate W as illustrated in FIG. 5A.

In a subsequent process ST2, plasma from a rare gas is formed within the chamber 10. In the process ST2, the rare gas is supplied into the chamber 10. In the process ST2, an $N_2$ gas and/or an $O_2$ gas as well as the rare gas may be supplied into the chamber 10. If a silicon containing material of the first region R1 of the substrate W is the low dielectric constant material (for example, SiOC or SiOCH), an Ar gas, a mixed gas of a $N_2$ gas and an Ar gas, or a mixed gas of a $N_2$ gas, an $O_2$ gas and an Ar gas may be supplied into the chamber 10 in the process ST2. If the silicon containing material of the first region R1 of the substrate W is $SiO_2$, an Ar gas may be supplied into the chamber 10 in the process ST2.

In the process ST2, the above-described gas containing the rare gas is excited within the chamber to form the plasma. In the process ST2, rare gas ions from the plasma are supplied to the substrate W. As a result, the fluorocarbon contained in the deposit DP reacts with the silicon containing material of the first region R1, so that the first region R1 is etched as illustrated in FIG. 5B. In the process ST2, while the plasma is being formed, the magnetic field distribution is formed within the chamber 10 by the electromagnet 60. Specifically, the electromagnet 60 forms the magnetic field distribution in which the horizontal component on the edge side of the substrate is higher than the horizontal component on the center of the substrate W.

The controller 80 performs a second control to perform the process ST2. In the second control, the controller 80 controls the gas supply 41 to supply the above-described gas containing the rare gas into the chamber 10 and controls the first high frequency power supply 43 to supply the first high frequency power. In the second control, the controller 80 may further control the exhaust device 34 to adjust the pressure within the chamber 10. In the second control, the controller 80 further controls the second high frequency power supply 44 to supply the second high frequency power. Further, in the second control, the controller 80 controls the drive power supply 66 to form the above-described magnetic field distribution by the electromagnet 60.

In the exemplary embodiment, the process ST1 and the process ST2 are alternately repeated. In this exemplary embodiment, the controller 80 repeats the first control and the second control alternately. In this exemplary embodiment, a process ST3 is performed. In the process ST3, it is determined whether a stop condition is satisfied. The stop condition is used to determine whether or not to stop an alternating repetition of the process ST1 and the process ST2. The stop condition is satisfied, for example, when the process ST1 and the process ST2 have been alternately repeated a predetermined number of times. If it is determined in the third process ST3 that the stop condition is not satisfied, the process ST1 and the process ST2 are sequentially performed again. If it is determined in the third process ST3 that the stop condition is satisfied, the method MT is ended. As a result, the first region R1 is etched as illustrated in FIG. 5C. Further, each of the process ST1 and the process ST2 may be performed only once. In this case, the method MT does not include the process ST3.

In general, the density of plasma increases on the center of the substrate W and decreases on the edge side of the substrate W. In the method MT, the magnetic field distribution in which the horizontal component on the edge side of the substrate W is higher than the horizontal component on the center of the substrate W is formed while the rare gas ions are generated in the process ST2. Therefore, the density of plasma on the edge side of the substrate W increases. As a result, the plasma has the uniform density distribution in the diametric direction. Since the rare gas ions from the plasma having the above-described uniform density distribution are incident to the substrate W, the reaction between the fluorocarbon contained in the deposit and the silicon containing material of the first region is promoted. Meanwhile, the second region R2 is protected by the deposit DP. Therefore, the in-plane uniformity in the processing for selectively etching the first region R1 of the substrate W with respect to the second region R2 of the substrate W can be improved.

While various exemplary embodiments have been described above, various omissions, substitutions, and changes may be made without being limited to the above-described exemplary embodiments. Further, other exemplary embodiments can be implemented by combining elements in different exemplary embodiments.

For example, in the method MT, another plasma processing apparatus may be used as long as it is capable of forming the magnetic field. Examples of the other plasma processing apparatus which is different from the plasma processing apparatus 1 may include a capacitively coupled plasma processing apparatus, an inductively coupled plasma processing apparatus or a plasma processing apparatus, which forms plasma with a surface wave such as a micro wave.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

According to an exemplary embodiment, it is possible to improve the in-plane uniformity in a processing for selectively etching a first region of a substrate with respect to a second region of the substrate.

We claim:

1. An etching method performed in a plasma processing apparatus, the etching method being performed in a state where a substrate is placed in a chamber of the plasma processing apparatus, the etching method comprising:
    forming plasma from a processing gas containing a fluorocarbon gas within the chamber to form a deposit containing fluorocarbon on the substrate, the substrate having a first region formed of a silicon containing material and a second region formed of a metal containing material; and
    forming plasma from a rare gas within the chamber to etch the first region by supplying rare gas ions to the substrate to react the fluorocarbon contained in the deposit on the substrate with the silicon containing material of the first region,
    wherein, in the forming of the plasma from the processing gas, a magnetic field is not formed within the chamber by an electromagnet,
    in the forming of the plasma from the rare gas, a magnetic field distribution in which a horizontal component on an edge side of the substrate is higher than a horizontal component on a center of the substrate is formed by the electromagnet.

2. The etching method of claim 1,
    wherein the silicon containing material is $SiO_2$, SiOC or SiOCH.

3. The etching method of claim 1,
    wherein the metal containing material is any one of metal materials of titanium, tungsten, zirconium, aluminum, tantalum, cobalt or ruthenium, or an oxide, a nitride or a carbide of the corresponding metal material.

4. The etching method of claim 1,
    wherein the fluorocarbon gas contains a $C_4F_8$ gas and/or a $C_4F_6$ gas.

5. The etching method of claim 1,
wherein the forming of the plasma from the processing gas and the forming of the plasma from the rare gas are alternately repeated.

* * * * *